United States Patent [19]
Brechbill et al.

[11] Patent Number: 4,723,368
[45] Date of Patent: Feb. 9, 1988

[54] DISPLAY MOUNTING ARRANGEMENT

[75] Inventors: Dana L. Brechbill; Jon M. Skekloff, both of Ft. Wayne, Ind.

[73] Assignee: Hamilton Standard Controls, Inc., Farmington, Conn.

[21] Appl. No.: 766,155

[22] Filed: Aug. 15, 1985

[51] Int. Cl.⁴ .................................................. G09F 3/20
[52] U.S. Cl. ........................................ 40/5; 40/10 R; 40/489
[58] Field of Search ................... 40/5, 10 R, 489, 622

[56] References Cited
U.S. PATENT DOCUMENTS

| | | | |
|---|---|---|---|
| 226,474 | 4/1880 | Baker | 40/10 R |
| 3,358,395 | 12/1967 | Simonovic | 40/489 |
| 4,419,838 | 12/1983 | Taylor et al. | 40/489 |
| 4,505,061 | 3/1985 | Neuburger et al. | 40/10 R |

Primary Examiner—Robert P. Swiatek
Assistant Examiner—Wenceslao J. Contreras
Attorney, Agent, or Firm—Stephen A. Schneeberger

[57] ABSTRACT

A display element mounting arrangement provides a pair of display holders for frictionally-engaging and supporting an elongated display element at its opposite ends. The display holders are adapted to be mounted on and frictionally secured to a support member, such as a circuit board. Each display holder includes a display-engaging portion and a support member-engaging portion. The display-engaging portion includes four walls which define a chamber into which an end of the display is inserted. Friction tabs in the chamber aid in retainedly engaging the display. The support member-engaging portion includes a leg adapted to extend through and move in a slot which extends inward from an edge of the circuit board. A foot formed on the end of the leg is so spaced from the display-engaging portion as to provide frictional engagement between it and the circuit board.

10 Claims, 7 Drawing Figures

U.S. Patent  Feb. 9, 1988  4,723,368
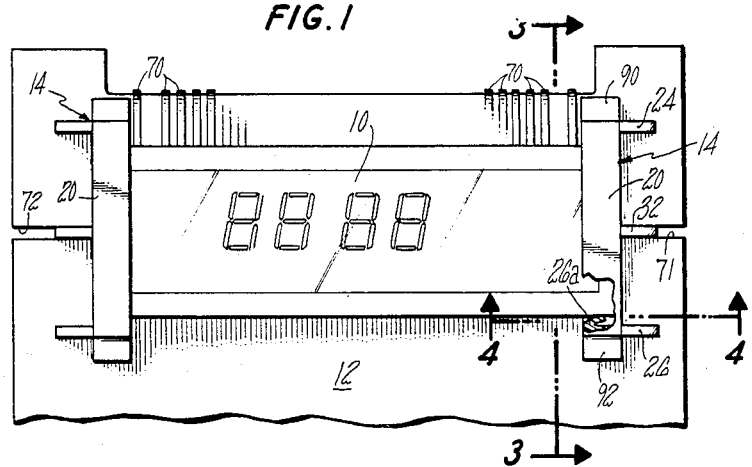
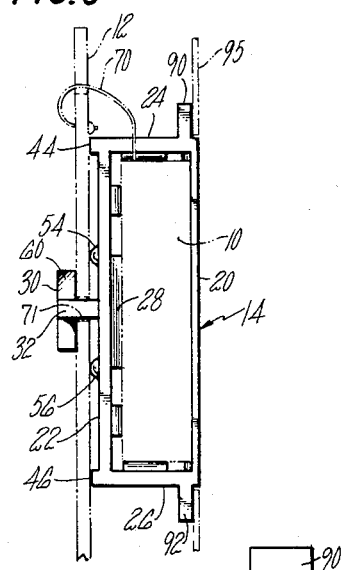
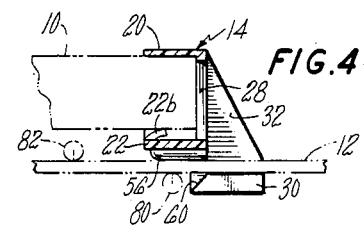
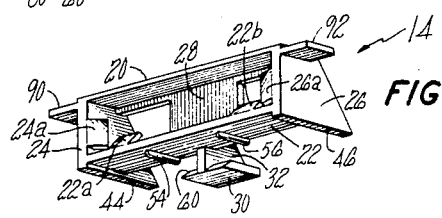
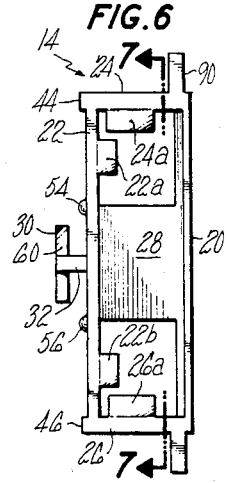
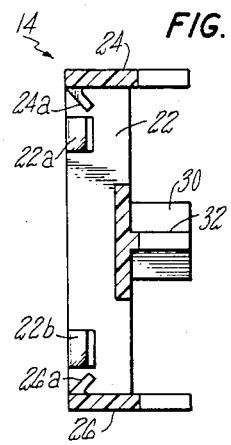
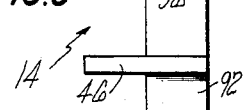

DISPLAY MOUNTING ARRANGEMENT

TECHNICAL FIELD

The invention relates to a display mounting arrangement and more particularly to an arrangement employing one or more display holders for mounting an electronic display, as for instance on a circuit board.

BACKGROUND ART

Numerous forms of electrically activated displays exist for utilization with various types of controls, appliances, instrumentation and the like. Similarly, many techniques and arrangements exist for mounting such displays in an operative position. Often the displays are contained in rectilinear packages which are disposed on or near a printed circuit board which contains appropriate control/drive circuitry.

One particular example involves a vacuum fluorescent display which is directly supported by a printed circuit board. Such displays are utilized frequently in various appliances for indicating time and other relevant variables. One arrangement for mounting such vacuum fluorescent displays to an associated printed circuit board has involved applying the display directly to the circuit board via an intermediate bonding agent, such as double-sided adhesive. Such arrangement, however, exhibits several limitations. For instance, the bonding of a display package to a printed circuit board with an adhesive requires two relatively uniform and smooth surfaces for engagement with the adhesive. Further, the longevity of the bond is only as good as the longevity of the adhesive. Further in this regard, such vacuum fluorescent displays typically have a large number of leads, i.e. 32, which extend from the display to the printed circuit board. These leads often are configured in a manner which results in a significant spring force being applied to the display in a direction tending either to cock or to dislodge the display from the printed circuit board.

Alternatively, the display may be mounted in a preformed rigid holder which is in turn secured to some mounting surface such as a printed circuit board or a housing. However, such holders typically must be sized and manufactured to accommodate a particular size of display element. This, however, may require maintaining a variety of sizes of display holders in inventory. Additionally, such holders may require close tolerances between the display element and the holder in order to provide a secure fit.

Accordingly, it is a principal object of the invention to provide an improved display holder. Included within this object is the provision of a display holder which is particularly suited for securely mounting a display element such as a vacuum fluorescent display, to a rigid substrate such as a circuit board.

A further object of the invention is the provision of an improved display holder which is capable of accommodating display elements of different lengths and possessing relatively large tolerances in one or more of its other dimensions.

DISCLOSURE OF INVENTION

According to the invention there is provided an improved arrangement for mounting a display element to a support member. The display element is of the type having its display along the length thereof. The mounting arrangement employs a novel display holder for mounting the display element to a support member such as a printed circuit board. The support member is provided with mounting slots for receiving one, or preferably a pair, of the display holders. Each display holder includes a display-engaging portion and a support member-engaging portion. The display-engaging portion is structured to frictionally engage the display element in a direction transverse to the length of the display element. The engaging portion of the support member is structured to extend through the mounting slot in the support member and to be in frictionally-secured engagement therewith to thereby mount the display element relative to the support member.

More specifically, a pair of such display holders are intended to engage the display element in a similar manner at its opposite ends and to be disposed in respective mounting slots in the printed circuit board.

BRIEF DESCRIPTION OF THE DRAWINGS

FIG. 1 is a front view of the display mounting arrangement of the invention;

FIG. 2 is a perspective view of one of the display holders of the mounting arrangement of the invention;

FIG. 3 is a sectional view of the mounting arrangement of FIG. 1 taken along line 3—3 thereof;

FIG. 4 is a sectional view of the mounting arrangement of FIG. 1 taken along line 4—4 thereof;

FIG. 5 is a rear view of a display holder of the invention;

FIG. 6 is a right, side view of the display holder of FIG. 5; and

FIG. 7 is a view taken along line 7—7 of FIG. 6.

BEST MODE FOR CARRYING OUT THE INVENTION

Referring now to the drawings, FIG. 1 illustrates a display mounting arrangement in which a display element, such as vacuum tube fluorescent display 10, is mounted to a substrate, such as printed circuit board 12, by means of a pair of display holders 14. The display holders 14 are each configured to frictionally engage a respective one of the ends of the elongated display 10. Moreover, each of the display holders 14 is configured to frictionally engage the circuit board 12 to thereby mount the display 10 relative to the board 12. While the following description of the respective display holders 14 will assume that the display 10 is generally elongated in the direction of the display and is rectangular in cross section, it will be understood that some variation in that geometry may be accommodated by a corresponding variation in the geometry of the respective holders 14. Each of the holders 14 is symmetrical about a horizontal plane extending through its vertical midpoint as viewed in FIG. 1, such that a holder 14 of only one geometry is suitable for use on either end of the display 10.

Each display holder 14 is molded of a relatively rigid plastic, such as polypropylene or the like. The display-engaging portion of holder 14 is formed by a pair of front and rear walls 20 and 22 and a pair of top and bottom walls 24 and 26 joined to one another to form a generally rectangular enclosure for receiving the cross section of the display 10 therewithin. The cross section of the display 10 is typically of some known standard dimensions for such displays. A closure portion 28 spans a part of the outer end of the display holder 14 to limit relative insertion of the display 10 thereinto. The dimensions of the walls 20, 22, 24 and 26 are such that the resulting cavity which receives display 10 is greater in both height and width than the respective display. However, frictionally retentive engagement between the holder 14 and display 10 is provided by inwardly-extending friction tabs on one or more of the respective walls.

Specifically, in the illustrated embodiment, a pair of friction tabs 22a and 22b extend from the interior surface of rear wall 22, a friction tab 24a extends from the interior surface of wall 24 and a friction tab 26a extends from the interior surface of wall 26. Each of the friction tabs 22a, 22b, 24a, 26a is generally rectangular in shape and extends generally toward the opposing wall thereby to effectively reduce the spacing between the opposed walls. The extent of the friction tabs is such that the effective reduction in spacing between opposed walls is sufficient to provide an interference fit with the package of display 10. Each of the friction tabs 22a, 22b, 24a and 26a resiliently deforms sufficiently to allow relative insertion of the display package 10, yet affords a frictional, retentive force which is sufficient to maintain the display package 10 firmly positioned within the holder 14.

Relative insertion of the display package 10 into the display holder 14 is facilitated by inclining the friction tabs 22a, 22b, 24a, and 26a toward the holder's outer end, represented by closure portion 28, at an angle of approximately 45°, as most clearly illustrated by friction tabs 24a and 26a in FIG. 7. Were that angle closer to 90° such that the friction tabs are substantially perpendicular to the walls from which they extend, the required insertion force is increased, possibly to an unacceptable level. Conversely, if the friction tabs are inclined toward the end at an even greater angle than that shown in FIG. 7, they may be more difficult to mold by conventional molding techniques than is economically warranted.

Although in the illustrated embodiment the friction tabs are associated with three of the four walls 20, 22, 24 and 26, it will be appreciated that those tabs may be either fewer or more numerous and they may be associated with as few as only one of the walls or with as many as all four of the walls. The arrangement illustrated in the present embodiment is preferred because the top and bottom friction tabs 24a and 26a serve to center the display 10 in a vertical direction and the vertically-spaced tabs 22a and 22b provide an even force which urges the display 10 against the forward wall 20 of the holder 14.

The display holder 14 is frictionally secured in mounted engagement with the printed circuit board 12 partly by means of a T-shaped member comprised of a foot 30 connected to a leg 32. The leg 32 is of generally triangular shape and extends rearward and outward from the closure portion 28 and the rear wall 22. The foot 30 is substantially flat and extends perpendicular to the leg 32 at its base. The foot 30 is spaced from the rearmost surface of the rear wall 22 of holder 14 by a predetermined distance which is intended to frictionally engage the thickness of the printed circuit board 12 therebetween. More specifically, the top and bottom walls 24 and 26 extend rearwardly approximately 0.020 inch beyond the rear surface of rear wall 22 to provide standoff surfaces 44 and 46 respectively. Approximately one-third the way down (or up) from the standoff surfaces 44 and 46 are a pair of ribs 54 and 56 of semicircular cross section extending horizontally across the rear surface 22 of holder 14. The ribs 54 and 56 also extend approximately 0.020 inch rearwardly from wall 22. Thus, the spacing between the foot 30 and the plane defined by the rearward extent of surfaces 44 and 46 and ribs 54 and 56, is nominally 0.055 inch. This dimension is normally sufficient to receive one standard printed circuit board 12 therebetween in mutual, frictionally-retained engagement. The nominal thickness of such a standard printed circuit board is 0.062 inch, with a tolerance of ±0.0075 inch. The inwardly-facing edge or surface 60 of foot 30 is ramped outwardly in the forward direction to facilitate the relative lead-in of a printed circuit board 12 between the foot 30 and the remainder of the holder 14.

Referring to FIG. 1, the printed circuit board 12 is provided with a pair of slots 71 and 72 formed in opposite edges thereof in alignment with and extending toward one another to permit relative mounting of the display holders 14 with the board. Each slot 71 and 72 extends through the entire thickness of the printed circuit board 12 and extends longitudinally inward from the edge a distance sufficient to accommodate positioning the display holders 14 for either a predetermined length, or a range of lengths, of display elements 10. The width of each slot 71 and 72 is only slightly greater than the width of the corresponding leg 32 of a respective display holder 14. In this way, the display holder 14 may be moved longitudinally of the display 10 by moving the leg 32 within the respective slot 71 or 72.

To mount the display element 10 on the printed circuit board 12, the numerous leads 70 extending from the display are electrically connected at their distal ends, as by wave soldering, to the circuit board 12. The display 10 is initially positioned to the rear of board 12 with leads 70 extending forwardly through the board. The display element 10 is then "folded" around the upper end of the board 12 such that the characters of the display are facing in a forward direction and the rear side of the display package is near the forward surface of the circuit board 12. Each of the display holders 14 is then positioned such that its respective leg 32 enters a respective slot 71 or 72, and the holders are then moved relatively toward one another to receive the respective ends of the display 10. The combination of the frictional retentive forces between the display 10 and the display holder 14, as well as between the display holder and the printed circuit board 12 provide a stable mounting arrangement for the display.

The foot 30 on leg 32 of display holder 14 is typically offset in a longitudinally outward direction relative to the display-engaging portion of the holder formed by walls 20, 22, 24 and 26. This offset is desirable to maximize the area on the reverse side of the circuit board 12 in which various electrical components, such as element 80 shown in phantom in FIG. 4, may be positioned.

In addition to the increased area on the rear of board 12 for positioning elements 80, the ribs 54 and 56 and standoff surfaces 44 and 46, the thickness of wall 22 and the spacing effect of friction tabs 22a and 22b cumulatively serve to space the rear surface of display element 10 sufficiently forward of the circuit board 12 to permit positioning of electrical components on the forward surface thereof, as illustrated by component 82 shown in phantom in FIG. 4. The top and bottom walls 24 and 26 of holder 14 may be extended longitudinally outward relative to the other two walls so as to extend the length of standoff surfaces 44 and 46 which engage the surface of board 12, thereby providing increased stability.

Display holder 14 may also include a pair of flanges 90 and 92 extending respectively upward and downward from the top and bottom walls 24 and 26 respectively. The flanges 90 and 92 are recessed slightly from the front wall 20 of the holder to create a shoulder. A frame 95, shown in phantom in FIG. 3, typically has a display opening and is positioned relative to circuit board 12 such that the flanges 90 and 92 of holder 14 are seated thereagainst.

Although this invention has been shown and described with respect to detailed embodiments thereof, it will be understood by those skilled in the art that various changes in form and detail thereof may be made without departing from the spirit and scope of the claimed invention.

Having thus described a typical embodiment of the invention, that which is claimed as new and desired to secure by Letters Patent of the United States is:

1. An arrangement for mounting a display element to a support member, the display element having its display along the length thereof, said arrangement comprising:

mounting slot means formed in said support member; and a pair of display holders, each said display holder having a display-engaging portion and a support member-engaging portion, said display-engaging portion including walls defining a chamber adapted to receive said display element extending thereinto and including resiliently deflectable friction means extending within said chamber for frictional engagement with said display element and said support member-engaging portion being structured to extend through said mounting slot means for frictionally-secured engagement with said support member thereby to mount said display element relative to said support member, said pair of display holders being adapted to be positioned to engage said display element at spaced locations along its said length.

2. The display element mounting arrangement of claim 1 wherein said display element is substantially rectangular in cross section transverse to its said length and said display-engaging portion of each said display holder includes four walls defining a substantially-rectangular chamber adapted to receive said display element extending thereinto.

3. The display element mounting arrangement of claim 1 wherein said support member is planar and of limited thickness and said support member-engaging portion of said display holder includes a leg extending from said display-engaging portion for extension through said mounting slot means and a foot joined to said leg in spaced relation with said display-engaging portion, the spacing between said foot and said display-engaging portion being substantially the same as said thickness of said support member so as to create an interference fit between said display holder and said support member.

4. The display element mounting arrangement of claim 2 wherein said support member is a circuit board.

5. The display element mounting arrangement of claim 4 wherein said mounting slot means comprises a pair of elongated slots extending inwardly toward one another from opposite edges of said circuit board, each one of said pair of display holders being associated with a respective one of said pair of slots.

6. The display element mounting arrangement of claim 5 wherein each of said display holders retainedly supports said display element at a respective opposite end of said display element.

7. The display element mounting arrangement of claim 1 wherein said friction means comprises at least one friction tab positioned on and extending from each of at least three of said walls which define said chamber.

8. The display element mounting arrangement of claim 7 wherein each of said friction tabs is inclined at an angle of approximately 45° to the respective said wall from which it extends.

9. The display element mounting arrangement of claim 5 wherein said display-engaging portion includes a pair of ridges disposed thereon on opposite sides of said leg and in facing relation with said foot thereby to determine said spacing between said foot and said display-engaging portion.

10. The display element mounting arrangement of claim 3 wherein said display-engaging portion includes a pair of ridges disposed thereon on opposite sides of said leg and in facing relation with said foot thereby to determine said spacing between said foot and said display-engaging portion.

* * * * *